(12) United States Patent
Botula et al.

(10) Patent No.: US 8,748,285 B2
(45) Date of Patent: Jun. 10, 2014

(54) NOBLE GAS IMPLANTATION REGION IN TOP SILICON LAYER OF SEMICONDUCTOR-ON-INSULATOR SUBSTRATE

(75) Inventors: Alan B. Botula, Essex Junction, VT (US); William F. Clark, Jr., Essex Junction, VT (US); Richard A. Phelps, Colchester, VT (US); BethAnn Rainey, Williston, VT (US); Yun Shi, South Burlington, VT (US); James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 13/280,681

(22) Filed: Nov. 28, 2011

(65) Prior Publication Data
US 2013/0134518 A1 May 30, 2013

(51) Int. Cl.
*H01L 21/76* (2006.01)

(52) U.S. Cl.
USPC .................................. 438/407; 257/E21.319

(58) Field of Classification Search
USPC ......... 438/407, 440, 473, 576, 526, 766, 162; 257/131, 156, E27.119, 292, E31.061, 257/E29.336, 288, E21.319, E21.32
See application file for complete search history.

(56) References Cited

U.S. PATENT DOCUMENTS

| | | | |
|---|---|---|---|
| 5,527,724 A | 6/1996 | Brady | |
| 6,111,305 A * | 8/2000 | Yoshida et al. | 257/656 |
| 6,486,513 B1 | 11/2002 | Matsumoto et al. | |
| 6,495,887 B1 | 12/2002 | Krishnan et al. | |
| 6,624,037 B2 | 9/2003 | Buynoski et al. | |
| 6,713,819 B1 * | 3/2004 | En et al. | 257/369 |
| 6,730,964 B2 | 5/2004 | Horiuchi | |
| 6,774,436 B1 | 8/2004 | Yu et al. | |
| 7,067,881 B2 | 6/2006 | Matsumoto et al. | |
| 7,227,204 B2 * | 6/2007 | Maciejewski et al. | 257/288 |
| 7,482,252 B1 * | 1/2009 | Wu et al. | 438/479 |
| 7,825,016 B2 * | 11/2010 | Giles | 438/528 |
| 8,410,573 B2 * | 4/2013 | Ohtsuki et al. | 257/506 |
| 2006/0186456 A1 * | 8/2006 | Burnett et al. | 257/315 |
| 2006/0246680 A1 * | 11/2006 | Bhattacharyya | 438/400 |
| 2006/0270125 A1 * | 11/2006 | Domae | 438/151 |
| 2007/0023833 A1 * | 2/2007 | Okhonin et al. | 257/347 |
| 2008/0023778 A1 * | 1/2008 | Henson et al. | 257/412 |
| 2009/0280620 A1 | 11/2009 | Yoshida et al. | |

FOREIGN PATENT DOCUMENTS

WO WO2009054115 * 4/2009 ............ H01L 29/786

* cited by examiner

*Primary Examiner* — Daniel Luke
*Assistant Examiner* — Latanya N Crawford
(74) *Attorney, Agent, or Firm* — Cantor Colburn LLP; Michael LeStrange (57) ABSTRACT

A semiconductor structure includes a semiconductor-on-insulator substrate, the semiconductor-on-insulator substrate comprising a handle wafer, a buried oxide (BOX) layer on top of the handle wafer, and a top silicon layer on top of the BOX layer; and an implantation region located in the top silicon layer, the implantation region comprising a noble gas.

12 Claims, 14 Drawing Sheets

NOBLE GAS IMPLANTATION REGION IN TOP SILICON LAYER OF SEMICONDUCTOR-ON-INSULATOR SUBSTRATE

BACKGROUND

This disclosure relates generally to the field of semiconductor-on-insulator substrates, and semiconductor structures within and upon semiconductor-on-insulator substrates.

Semiconductor structures include semiconductor substrates on which semiconductor devices, such as but not limited to resistors, transistors, diodes and capacitors, are formed. The semiconductor devices are connected by patterned conductor layers that are separated by dielectric regions.

Within the context of semiconductor substrates that are used in the fabrication of semiconductor structures, semiconductor-on-insulator substrates, such as silicon-on-insulator (SOI), may be used. Semiconductor-on-insulator substrates include a base semiconductor substrate (or handle wafer), a buried dielectric layer (which may be buried oxide, referred to as BOX) located on the base semiconductor substrate, and a relatively thin surface semiconductor layer (also referred to a top silicon layer) located on the buried dielectric layer. Under circumstances where the base semiconductor substrate and the surface semiconductor layer of a semiconductor-on-insulator substrate comprise a single semiconductor material (such as silicon) having a single crystallographic orientation, the semiconductor-on-insulator substrate may under certain circumstances be fabricated by incorporation of a buried dielectric layer within a thickness of a bulk semiconductor substrate.

Semiconductor-on-insulator substrates find many uses in semiconductor structure fabrication, including complementary metal oxide semiconductor (CMOS) structures. However, use of semiconductor-on-insulator substrates for high voltage CMOS devices may result in reduced performance of the high voltage devices. In high voltage semiconductor-on-insulator technology, the handle wafer is grounded during operation, and the top silicon layer above the BOX may be at high potential. In areas of the top silicon layer that are p-type, an accumulation layer may form during operation, while in areas of the top silicon layer that are n-type, an inversion layer may form. These accumulation and inversion layers cause the breakdown performance of the device to be degraded.

BRIEF SUMMARY

In one aspect, a semiconductor structure includes a semiconductor-on-insulator substrate, the semiconductor-on-insulator substrate comprising a handle wafer, a buried oxide (BOX) layer on top of the handle wafer, and a top silicon layer on top of the BOX layer; and an implantation region located in the top silicon layer, the implantation region comprising a noble gas.

In another aspect, a method of forming of a semiconductor structure on a semiconductor-on-insulator substrate, the semiconductor-on-insulator substrate comprising a handle wafer, a buried oxide (BOX) layer on top of the handle wafer, and a top silicon layer on top of the BOX layer includes forming a shallow trench isolation region in the top silicon layer; implanting the top silicon layer with a noble gas to form an implantation region in the top silicon layer; and forming one or more semiconductor devices in the implanted top silicon layer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a semiconductor structure including a noble gas implantation region for high voltage devices in a top silicon layer of a semiconductor-on-insulator substrate, and method of forming a noble gas implantation region in a top silicon layer of a semiconductor-on-insulator substrate for high voltage devices, are provided, with exemplary embodiments being discussed below in detail. To prevent formation of accumulation or inversion layers in high voltage devices, including PiN diodes, field effect transistors (FETs), bipolar junction transistors (BJTs), or any other active device that includes a lateral n-p junction that is designed to drop a relatively high voltage, an implantation region is formed by implantation with a noble gas, which may be one of helium (He), neon (Ne), argon (Ar), in the top silicon layer of the semiconductor-on-insulator substrate. This implantation creates interfacial trap states in the top silicon layer that suppress the accumulation of holes, such that the carrier mobility along the back side of the high voltage devices will be reduced and the leakage path along the back side will be suppressed. In various embodiments, an implantation region may be located anywhere in the top silicon layer; the depth of the implantation region is selected to control floating body effects of high voltage devices in which the implantation region is located, and may be at the interface between the top silicon layer and the BOX, or in the bottom half of the top silicon layer in some preferred embodiments. The semiconductor-on-insulator substrate may include silicon-on-insulator or silicon-on-glass substrates, including silicon-on-sapphire, in various embodiments.

The implantation may be a blanket implantation across an entire semiconductor-on-insulator substrate in some embodiments; in other embodiments, portions of the top surface of the semiconductor-on-insulator substrate may be masked before the implantation is performed. The mask may cover lower voltage device areas located on the same substrate, or areas between high voltage devices. In embodiments in which the substrate is masked before implantation, the resulting implantation regions may be located across lateral n-p junctions, PiN junctions, or the n-well, p-well, and channel regions of n-type FETs (NFETs) or p-type FETs (PFETs). In some embodiments, the top silicon layer may be a thin film, with shallow trench isolation (STI) regions comprising oxide formed in the top silicon layer abutting the BOX to provide isolation between devices. The top silicon layer may be a thick film in other embodiments, in which case the STI regions do not abut the BOX, and deep trench isolation regions may be formed in the top silicon layer for full isolation. The noble gas implantation may be performed after the STI anneal that is performed in the course of STI formation, as exposure to annealing may degrade the performance of the He, Ne, Ar, or Xe dopants in the implantation region.

Figure 1A:
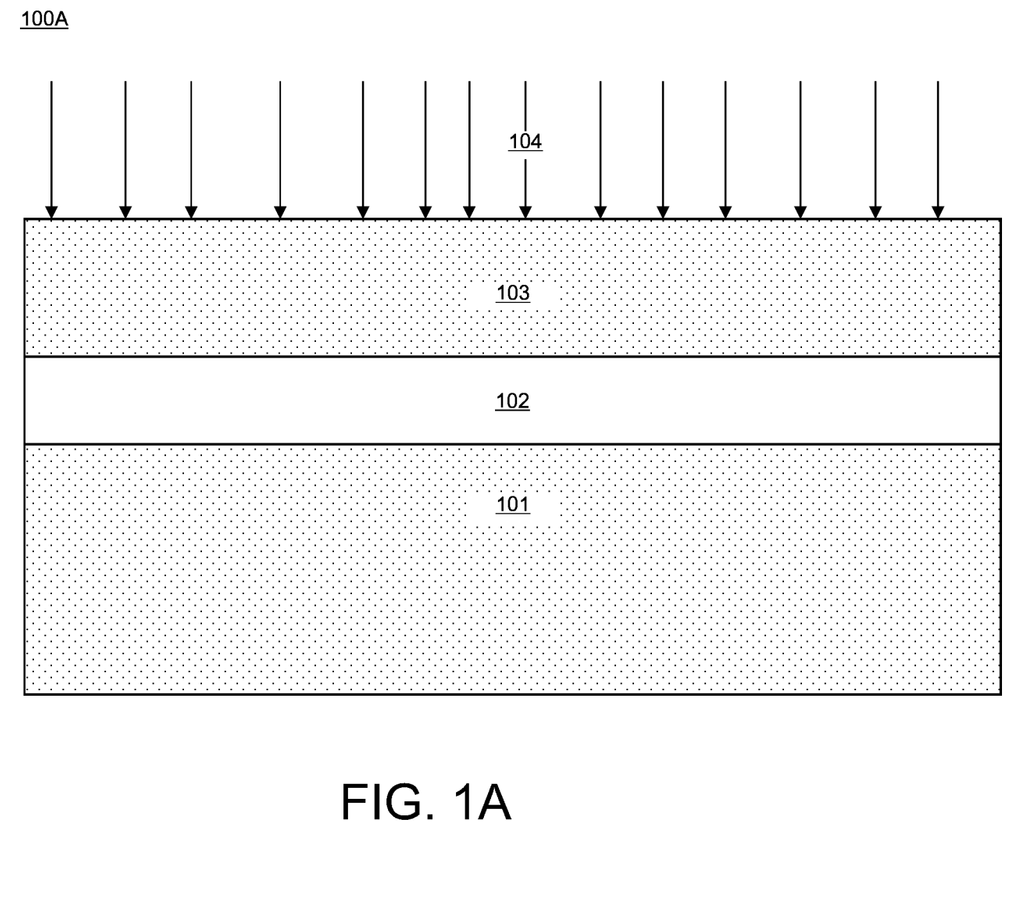
FIG. 1A illustrates a cross-section of an embodiment of a semiconductor-on-insulator substrate during implantation.
Figure 1B:
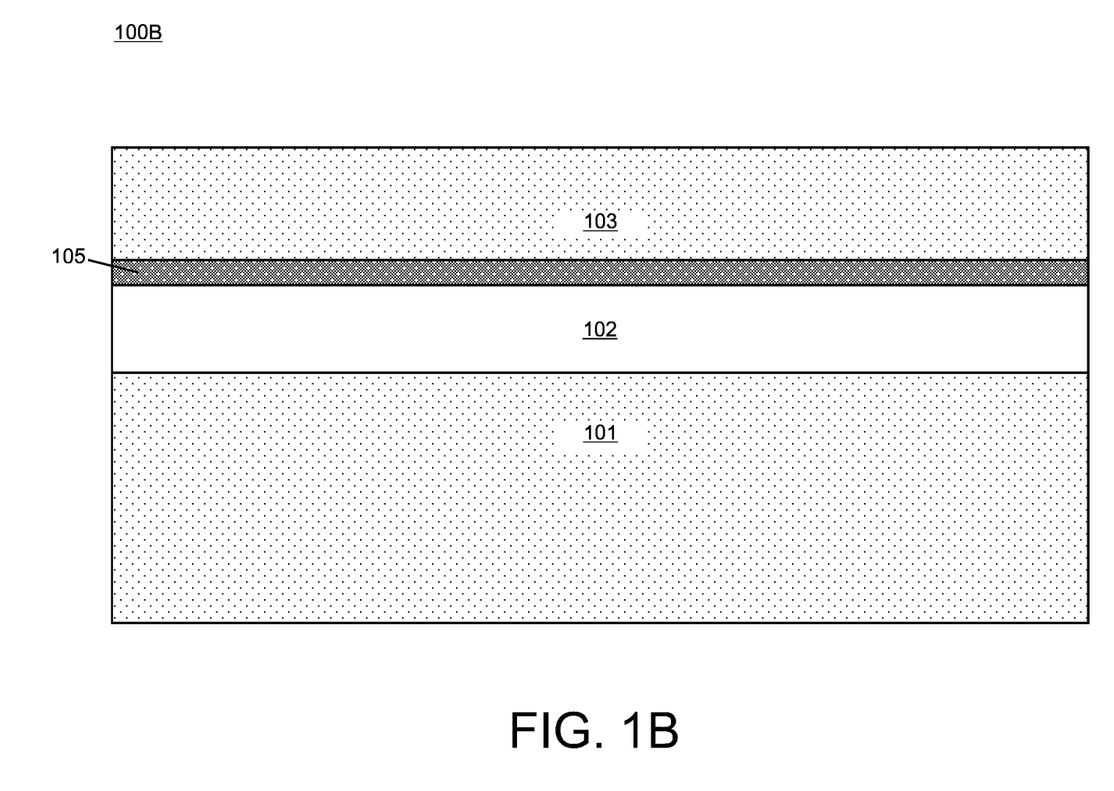
FIG. 1B illustrates a cross-section of an embodiment of the semiconductor-on-insulator substrate of FIG. 1A with an implantation region located at the interface between the top silicon layer and the BOX.
Figure 1C:
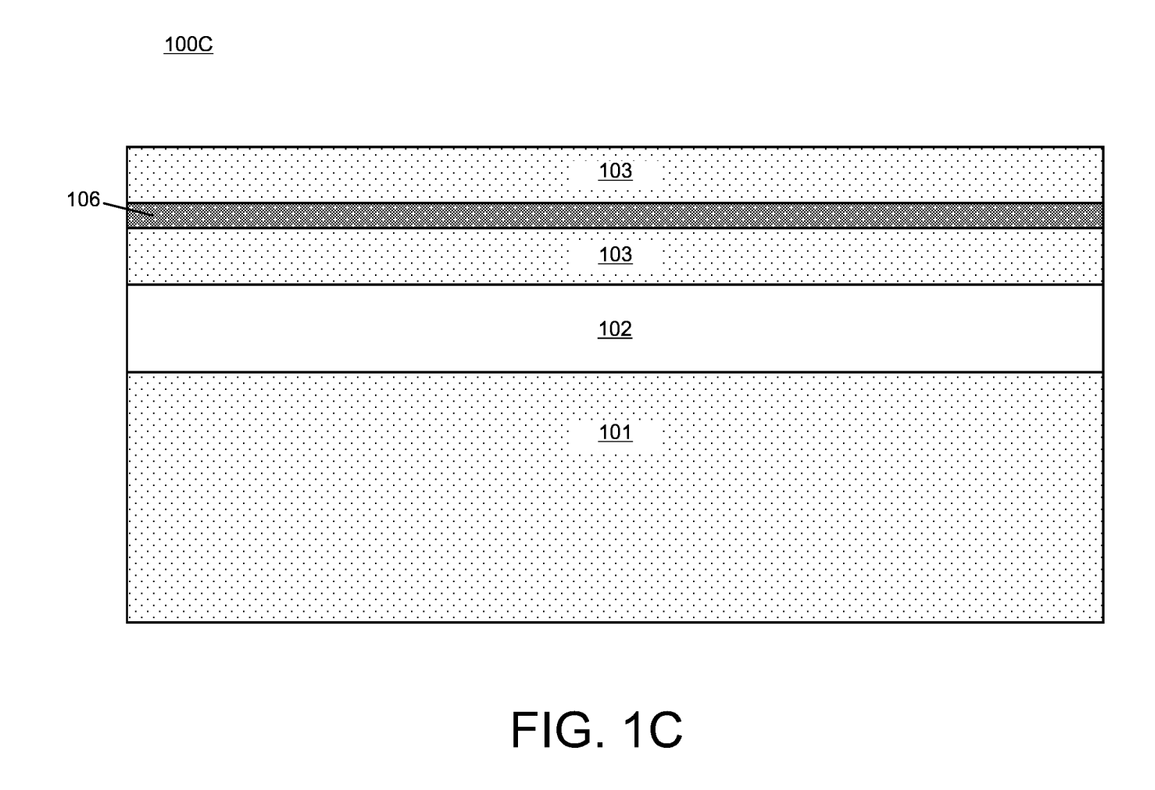
FIG. 1C illustrates a cross-section of an embodiment of the semiconductor-on-insulator substrate of FIG. 1A with an implantation region located in the top silicon layer.

FIG. 1A shows an embodiment of a semiconductor-on-insulator substrate during noble gas implantation to form an implantation region for high voltage devices that are subsequently formed on the semiconductor-on-insulator substrate. The semiconductor-on-insulator substrate 100A includes handle wafer 101, BOX 102, and top silicon layer 103. Handle wafer 101 may be silicon, glass, or sapphire in various embodiments. BOX 102 is oxide. Top silicon layer 103 may be a thin or a thick top silicon layer in various embodiments. Implantation 104 includes one of He, Ne, Ar, or Xe. The energy and dose of implantation 104 may vary based on the noble gas that comprises implantation 104 and the desired depth of the implantation region. In an embodiment in which implantation 104 comprises Ar, the energy may be from about 200 kiloelectron volts (KeV) to about 1200 KeV, and the dose may be in a range of $2E13/cm^2$. Implantation 104 may be a blanket implantation of the entire surface of the substrate 100A in some embodiments, while in other embodiments, an implant mask (not shown) may be formed as needed on the top silicon layer 103 of the substrate 100A before the implantation is performed. In such embodiments, the implant mask may cover, for example, low voltage devices located on the same substrate, or areas that are located in between high voltage devices. The implantation 104 forms implantation regions in the top silicon layer 103, embodiments of which are shown in FIGS. 1B and 1C. In device 100B of FIG. 1B, implantation region 105 is located in top silicon layer 103 at the interface between top silicon layer 103 and BOX 102. In device 100C of FIG. 1C, the implantation region 106 is located in the middle of top silicon layer 103. In various embodiments, an implantation region such as implantation regions 105 or 106 may be located anywhere in a top silicon layer such as top silicon layer 103; the depth of the implantation region is selected to control floating body effects of high voltage devices in which the implantation region is located, and may be in the bottom half of the top silicon layer in some embodiments. After formation of the implantation regions, such as implantation regions 105 and 106, high voltage devices (not specifically shown in FIGS. 1B and 1C) are formed in top silicon layer 103.

Figure 3A:
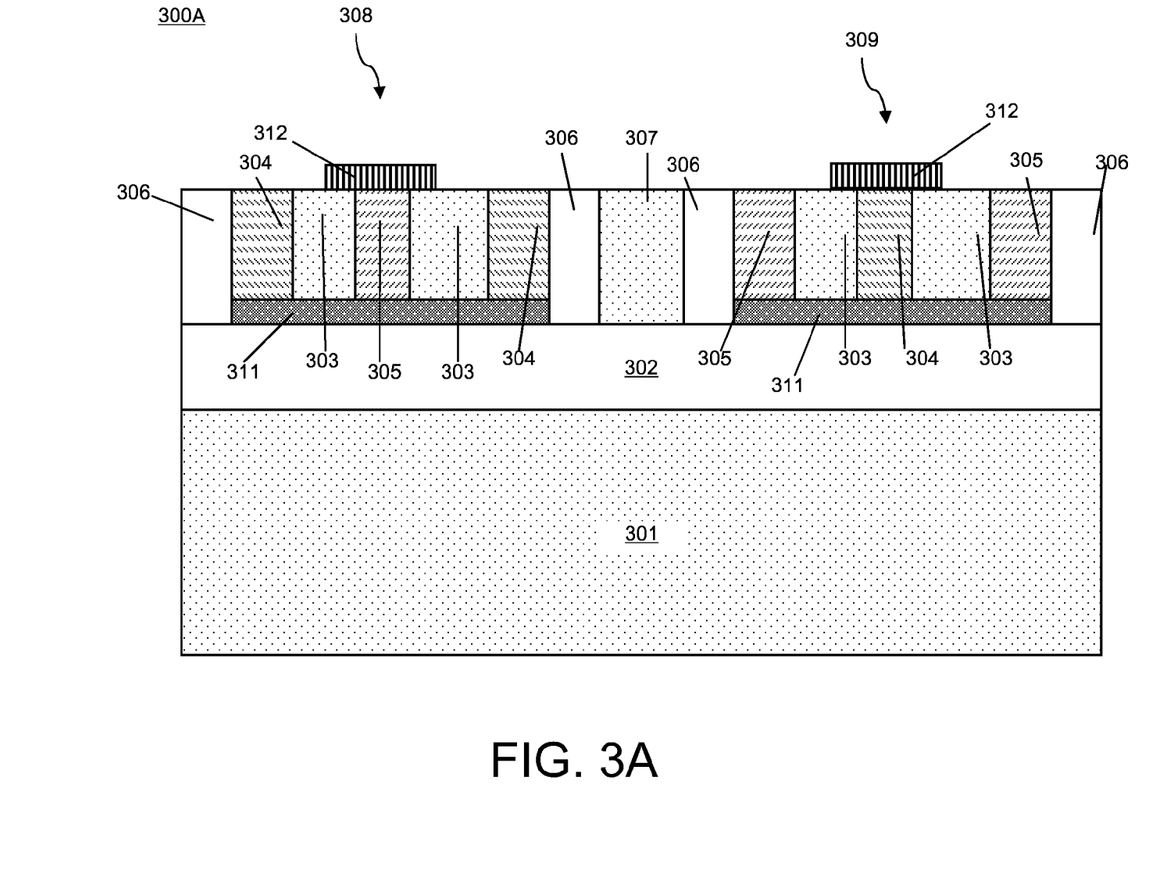
FIG. 3A illustrates a cross-section of an embodiment of a semiconductor structure including an NFET and a PFET with an implantation region located at the interface between the top silicon layer and the BOX.
Figure 3B:
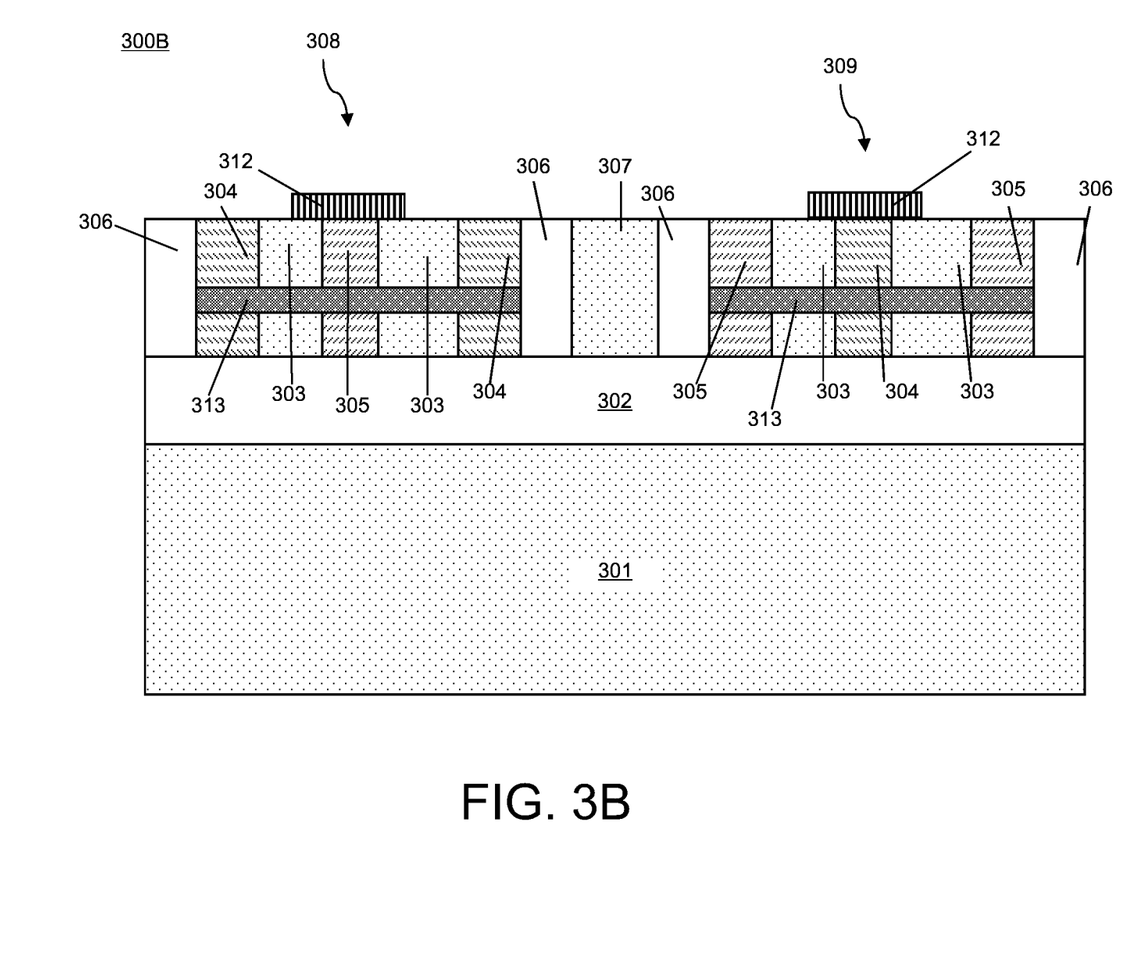
FIG. 3B illustrates a cross-section of an embodiment of a semiconductor structure including an NFET and a PFET with an implantation region located in the top silicon layer.
Figure 4A:
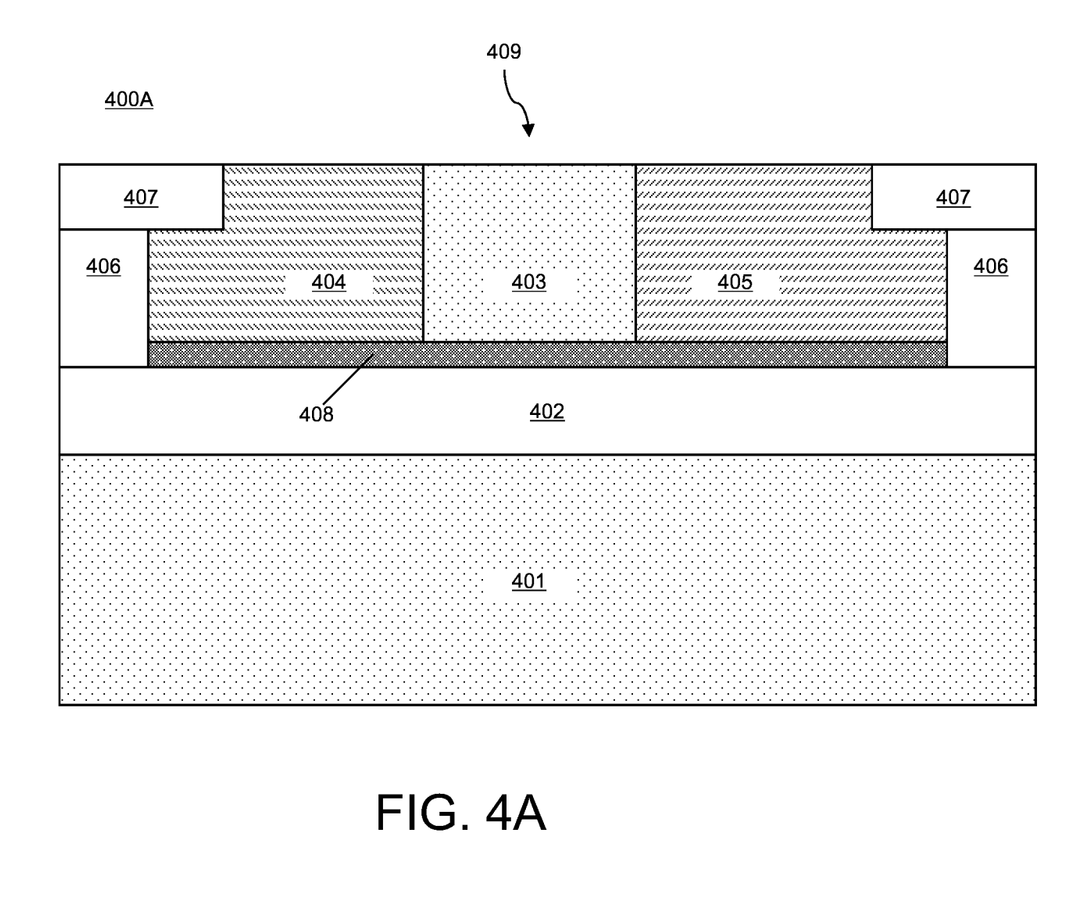
FIG. 4A illustrates a cross-section of an embodiment of a semiconductor structure including a PiN junction with an implantation region located at the interface between the top silicon layer and the BOX.
Figure 4B:
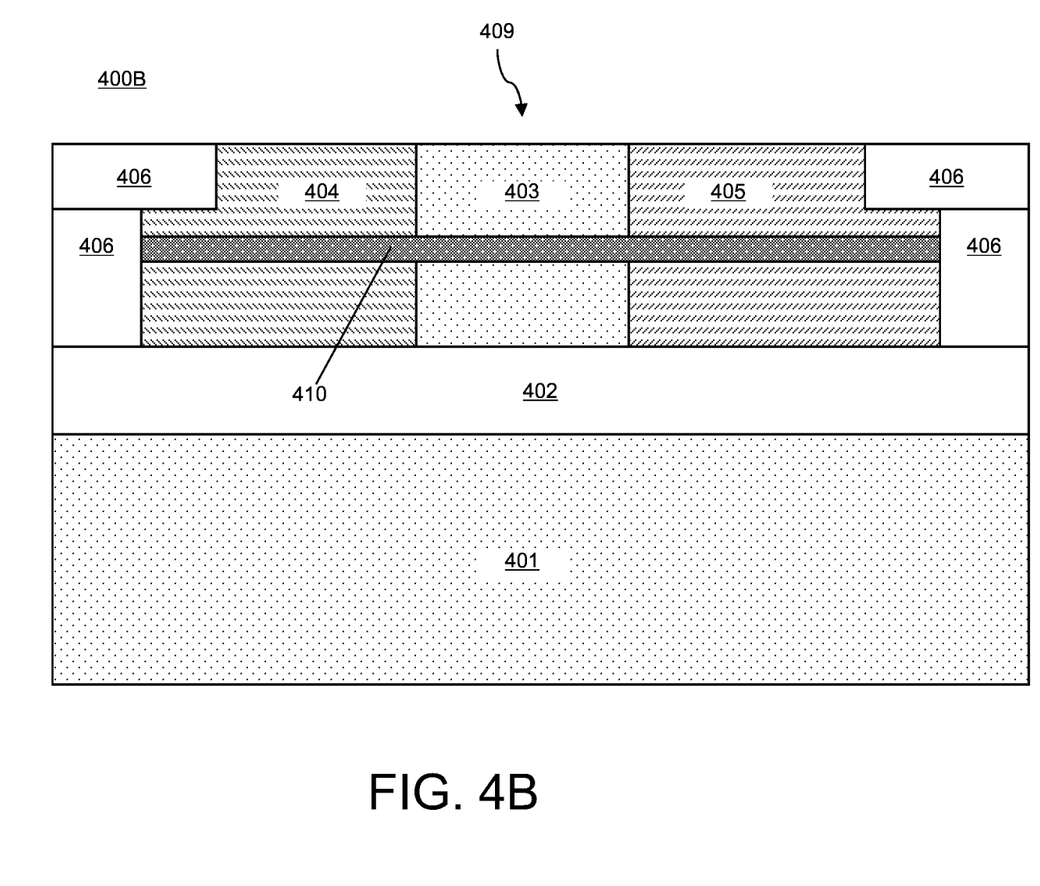
FIG. 4B illustrates a cross-section of an embodiment of a semiconductor structure including a PiN junction with an implantation region located in the top silicon layer.

A semiconductor-on-insulator substrate including a noble gas implantation region, such as implantation regions 105 and 106 of FIGS. 1B and 1C, in the top silicon layer may be used to form any appropriate type of high voltage CMOS device, including but not limited to a PiN diode, a FET, or a BJT. Some embodiments of devices formed on a semiconductor-on-insulator substrate with an implantation region in the top silicon layer are shown in FIGS. 2A-D, 3A-B, and 4A-B. FIGS. 2A-D illustrate formation of embodiments of a PiN junction on a semiconductor-on-insulator substrate with an implantation region in the top silicon layer in which the top silicon layer comprises a thin silicon layer. FIGS. 3A-B illustrate embodiments of FET devices formed on a semiconductor-on-insulator substrate with an implantation region in the top silicon layer. FIGS. 4A-B illustrate embodiments of a PiN junction on a semiconductor-on-insulator substrate with an implantation region in the top silicon layer in which the top silicon layer comprises a thick silicon layer with deep trench isolation regions.

Figure 2A:
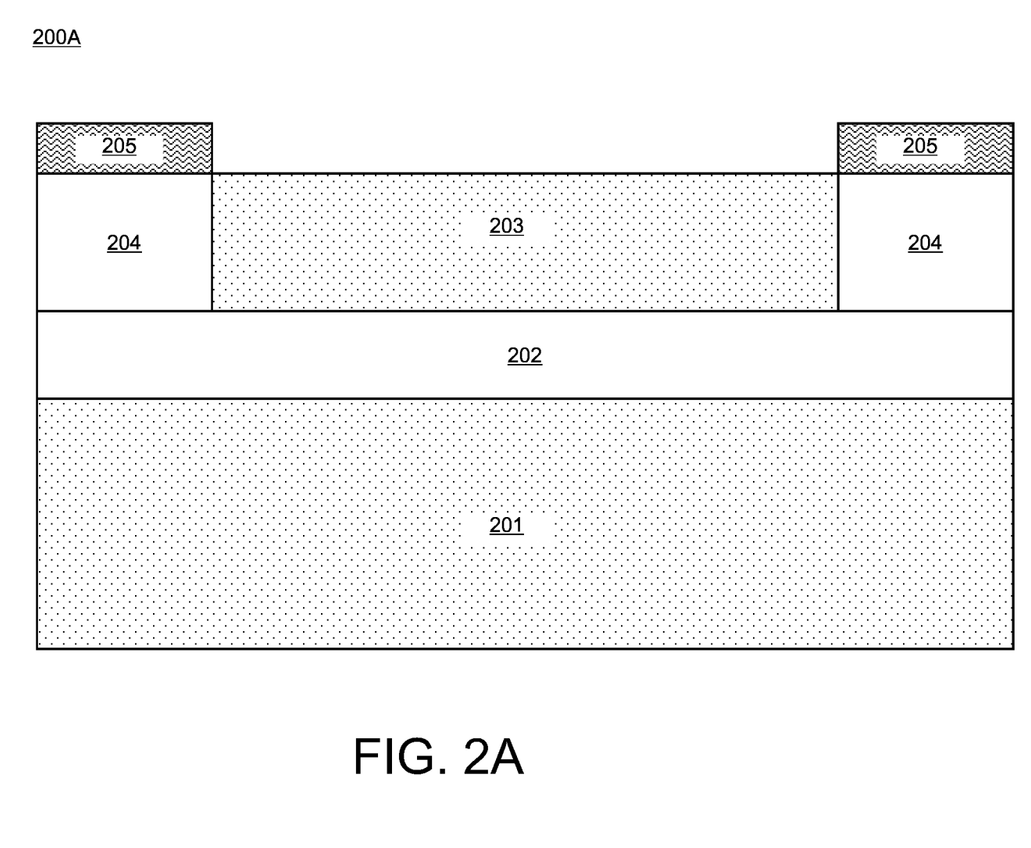
FIG. 2A illustrates a cross-section of an embodiment a semiconductor-on-insulator substrate after formation of shallow trench isolation (STI) regions and an implant mask
Figure 2B:
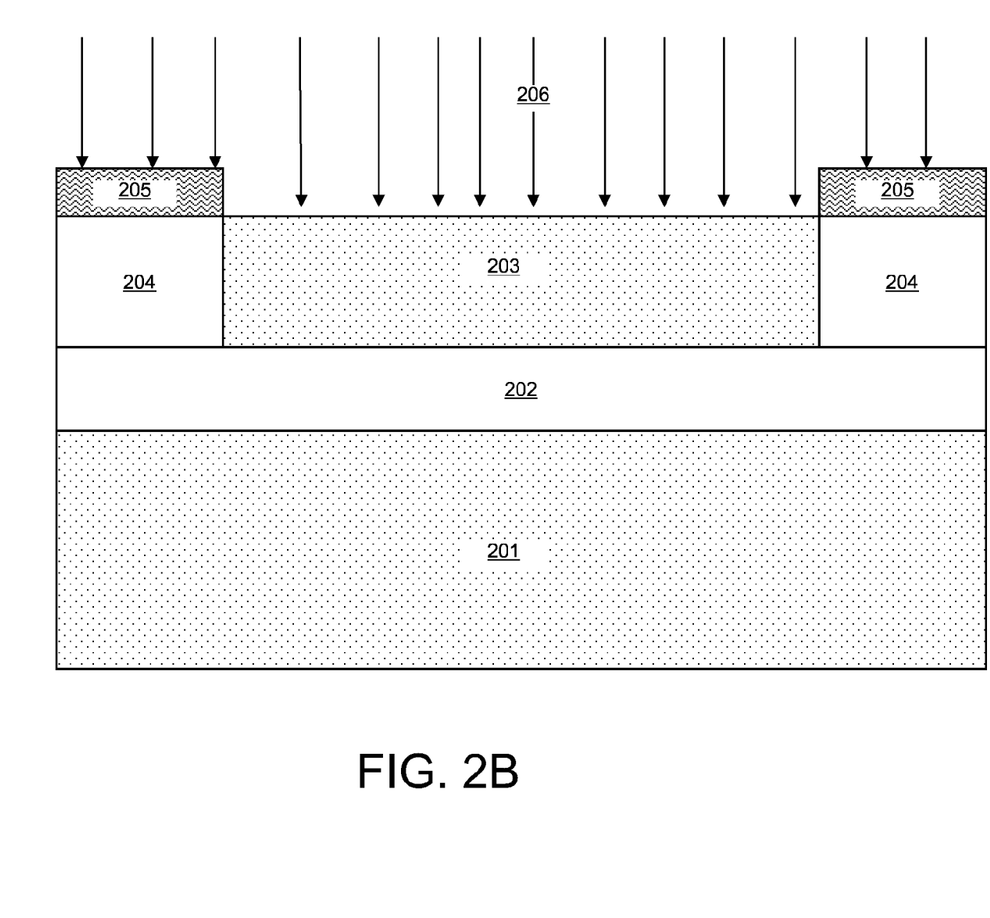
FIG. 2B illustrates a cross-section of an embodiment of the semiconductor-on-insulator substrate of FIG. 2A during implantation.
Figure 2C:
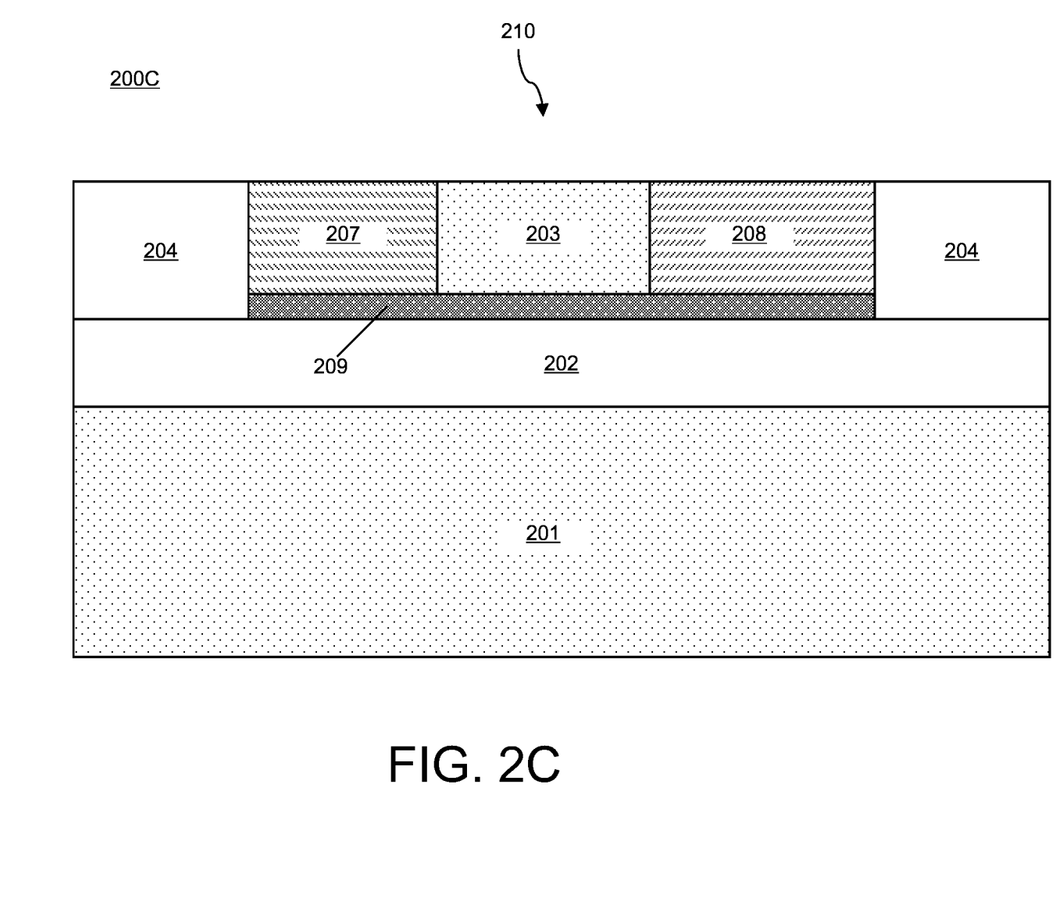
FIG. 2C illustrates a cross-section of an embodiment of the semiconductor-on-insulator substrate of FIG. 2B after formation of a PiN junction with an implantation region located at the interface between the top silicon layer and the BOX.
Figure 2D:
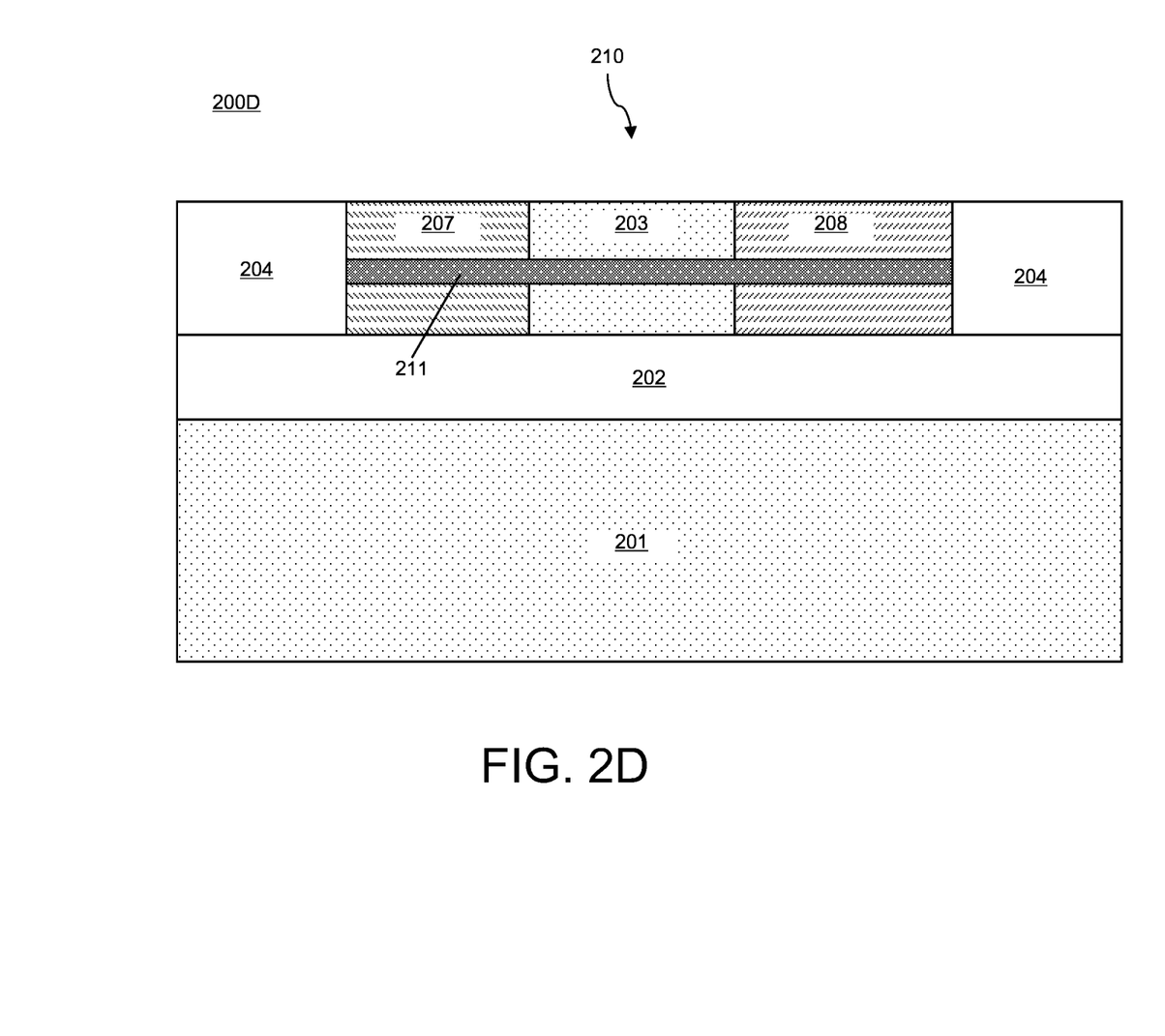
FIG. 2D illustrates a cross-section of an embodiment of semiconductor-on-insulator substrate of FIG. 2B after formation of a PiN junction with an implantation region located in the top silicon layer.

FIGS. 2A-D illustrate formation of embodiments of a PiN junction on a semiconductor-on-insulator substrate with an implantation region in the top silicon layer in which the top silicon layer comprises a thin silicon layer. In FIG. 2A, a semiconductor-on-insulator substrate 200A is shown after formation of STI regions 204 in top silicon layer 203, and an implant mask 205. Semiconductor-on-insulator substrate 200A includes handle wafer 201, which may be silicon or sapphire in various embodiments, BOX 202, and top silicon layer 203. STI regions 204 may be formed using any appropriate technique, and may include an annealing step. Because annealing may degrade the performance of the He, Ne, Ar, or Xe dopants in the implantation region, the STI regions 204 are formed before implantation. The implant mask 205 may cover low voltage device areas of the substrate, or areas that are located in between high voltage devices. The device 200A of FIG. 2A is then subjected to implantation 206, which is one of He, Ne, Ar, or Xe, as shown in FIG. 2B. Implantation 206 forms an implantation region in the top silicon layer 203. After implantation 206 is completed, a high voltage device is formed in top silicon layer 203. Embodiments of a high voltage PiN junction with an implantation region are shown in FIGS. 2C-D. In device 200C of FIG. 2C, the implantation region 209 is located at the interface between BOX 202 and the top silicon layer 203, and extends across the PiN junction 210, which includes n-well 207, p-well 208, and intrinsic silicon 203. STI regions 204 are located on either side of the PiN junction 210. In device 200D of FIG. 2D, the implantation region 211 is in the middle of the top silicon layer 203, and extends across the PiN junction 210, which includes n-well 207, p-well 208, and intrinsic silicon 203. STI regions 204 are located on either side of the PiN junction 210. In various embodiments, a He, Ne, Ar, or Xe implantation region such as implantation regions 209 or 211 may be located at any appropriate depth in the top silicon layer 203. The depth of the He, Ne, Ar, or Xe implantation region in the top silicon layer may be selected to control floating body effects in the high voltage devices, and may be in the bottom half of the top silicon layer 203 in some embodiments.

FIGS. 3A-B show embodiments of a semiconductor structure including an NFET and a PFET formed on a semiconductor-on-insulator substrate with a noble gas implantation region in the top silicon layer. Devices 300A-B include handle wafer 301, which may be silicon or sapphire in various embodiments, BOX 302, and top silicon layer 303. In device 300A of FIG. 3A, the implantation regions 311 are located at the interface between BOX layer 302 and the top silicon layer, which is located on top of BOX 302 and in which an NFET 308 and a PFET 309 are formed. NFET 308 includes n-wells 304 and a p-well 305 separated by intrinsic silicon 303, and a gate 312. PFET 309 includes an n-well 304 and p-wells 305 separated by intrinsic silicon 303, and a gate 312. STI regions 306 and intrinsic silicon 307 are located on either side of and in between the FETs 308 and 309. In device 300B of FIG. 3B, the implantation region 313 is located in the middle of the top silicon in NFET 308 and PFET 309. An He, Ne, Ar, or Xe implantation region such as implantation regions 311 or 313 may be located at any appropriate depth in the top silicon layer of a semiconductor-on-insulator substrate in various embodiments.

FIGS. 4A-B show embodiments of a PiN junction formed on a semiconductor-on-insulator substrate with a noble gas implantation region in a top silicon layer comprising a thick silicon layer with deep trench isolation regions. Devices 400A-B include handle wafer 401, which may be silicon or sapphire in various embodiments, BOX 402, and top silicon layer 403. In device 400A of FIG. 4A, the implantation region 408 is located at the interface between BOX 402 and the top silicon layer, in which a PiN junction 409 including n-well 404, p-well 405, and intrinsic silicon 403 is located. Deep trench isolation regions 406, which may comprise oxide, are located on either side of the PiN junction 409, and STI regions 407 are located on top of the deep trench isolation regions 406. In device 400B of FIG. 4B, the implantation region 410 is in the middle of the top silicon layer, which includes a PiN junction 409 including n-well 404, p-well 405, and intrinsic silicon 403. Deep trench isolation regions 406 and STI regions 407 are located on either side of the PiN junction 409. An He, Ne, Ar, or Xe implantation region such as implantation regions 408 or 410 may be located at any appropriate depth in the top silicon layer of a semiconductor-on-insulator substrate in various embodiments.

Figure 5A:
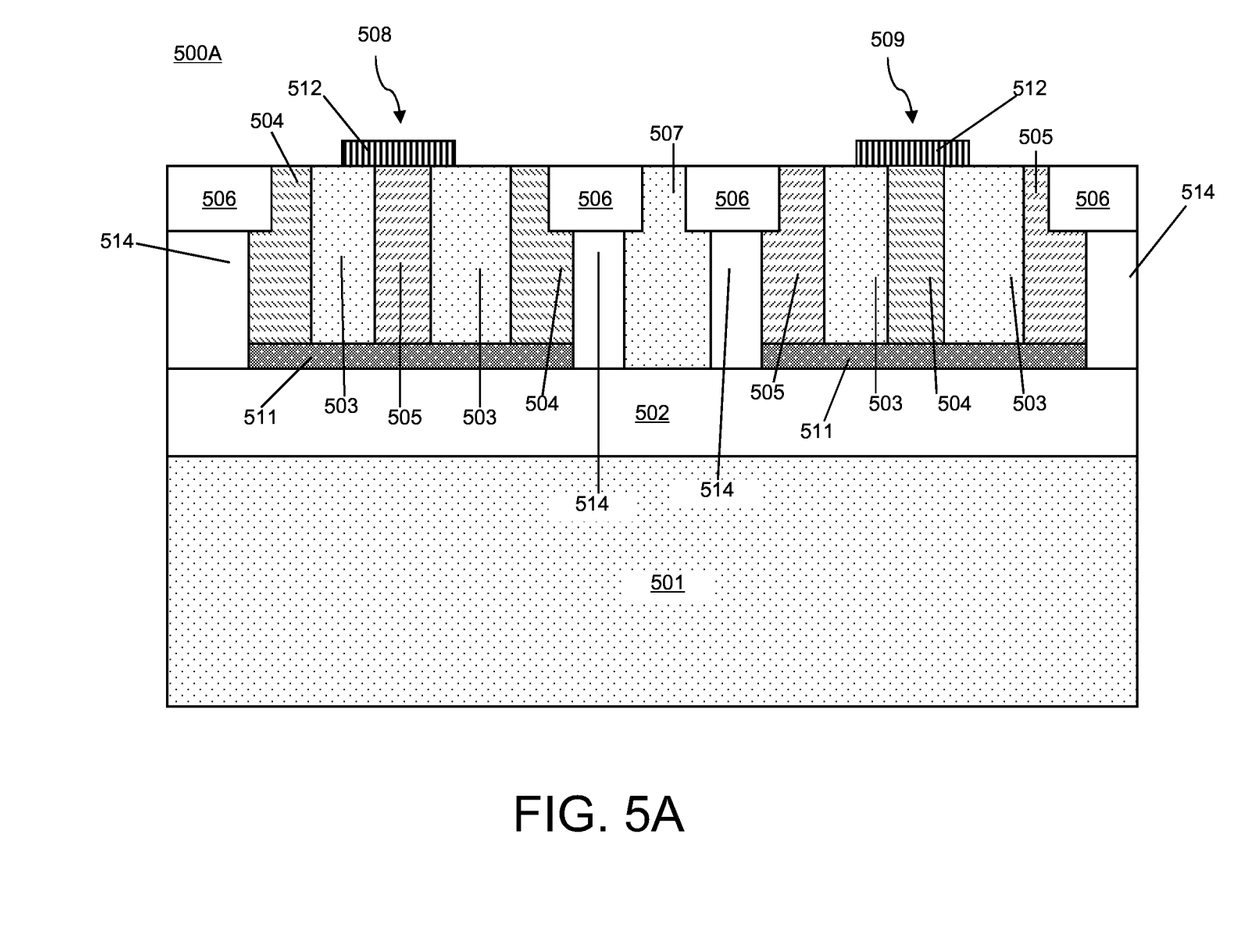
FIG. 5A illustrates a cross-section of an embodiment of a semiconductor structure including an NFET and a PFET with an implantation region located at the interface between the top silicon layer and the BOX.
Figure 5B:
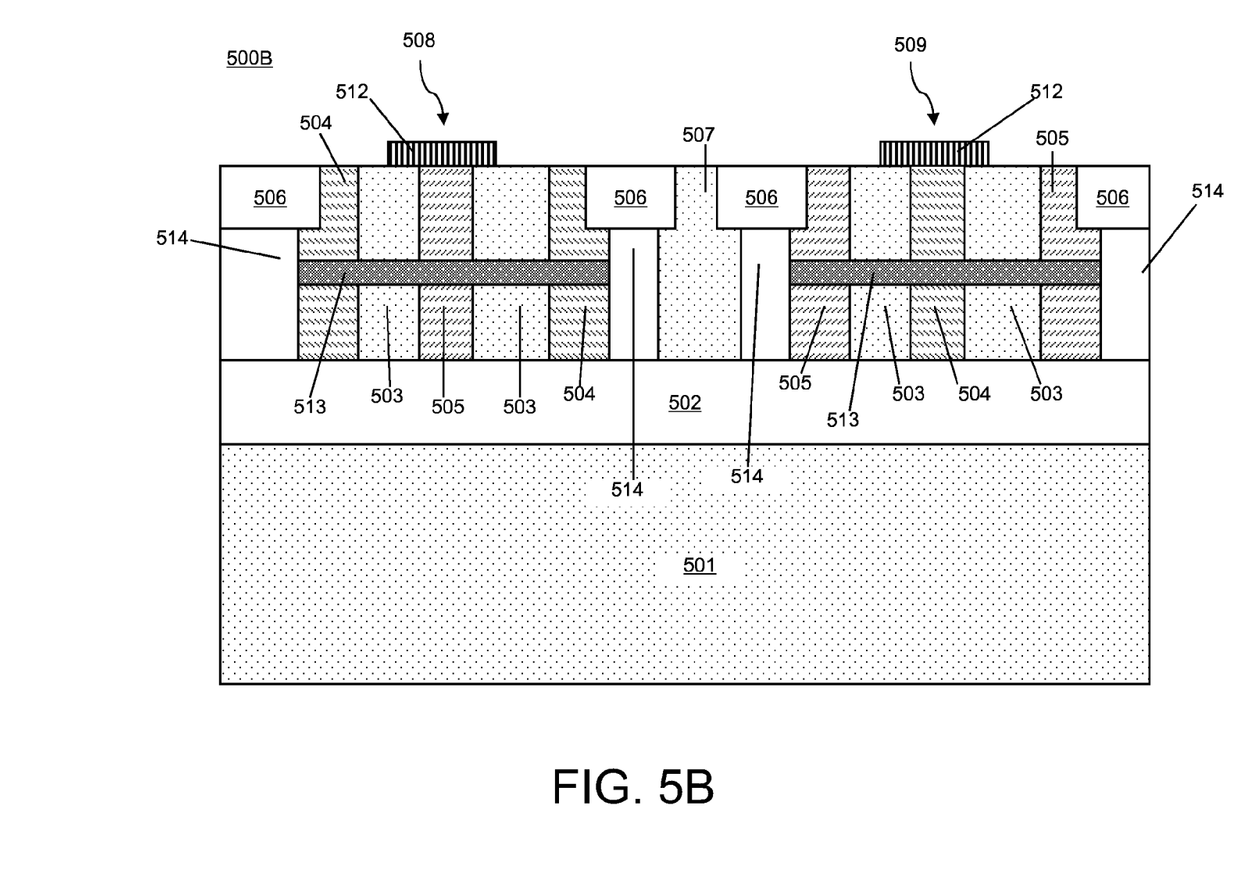
FIG. 5B illustrates a cross-section of an embodiment of a semiconductor structure including an NFET and a PFET with an implantation region located in the top silicon layer.

FIGS. 5A-B show embodiments of a semiconductor structure including an NFET and a PFET formed on a semiconductor-on-insulator substrate with a noble gas implantation region in the top silicon layer comprising a thick silicon layer with deep trench isolation regions. Devices 500A-B include handle wafer 501, which may be silicon or sapphire in various embodiments, BOX 502, and thick top silicon layer 503. In device 500A of FIG. 5A, the implantation regions 511 are located at the interface between BOX layer 502 and the top silicon layer, which is located on top of BOX 502 and in which an NFET 508 and a PFET 509 are formed. NFET 508 includes n-wells 504 and a p-well 505 separated by intrinsic silicon 503, and a gate 512. PFET 309 includes an n-well 504 and p-wells 505 separated by intrinsic silicon 503, and a gate 512. Deep trench isolation regions 514, STI regions 506 and intrinsic silicon 507 are located on either side of and in between the FETs 508 and 509. In device 500B of FIG. 5B, the implantation region 513 is located in the middle of the top silicon in NFET 508 and PFET 509. An He, Ne, Ar, or Xe implantation region such as implantation regions 511 or 513 may be located at any appropriate depth in the top silicon layer of a semiconductor-on-insulator substrate in various embodiments.

Figure 6:
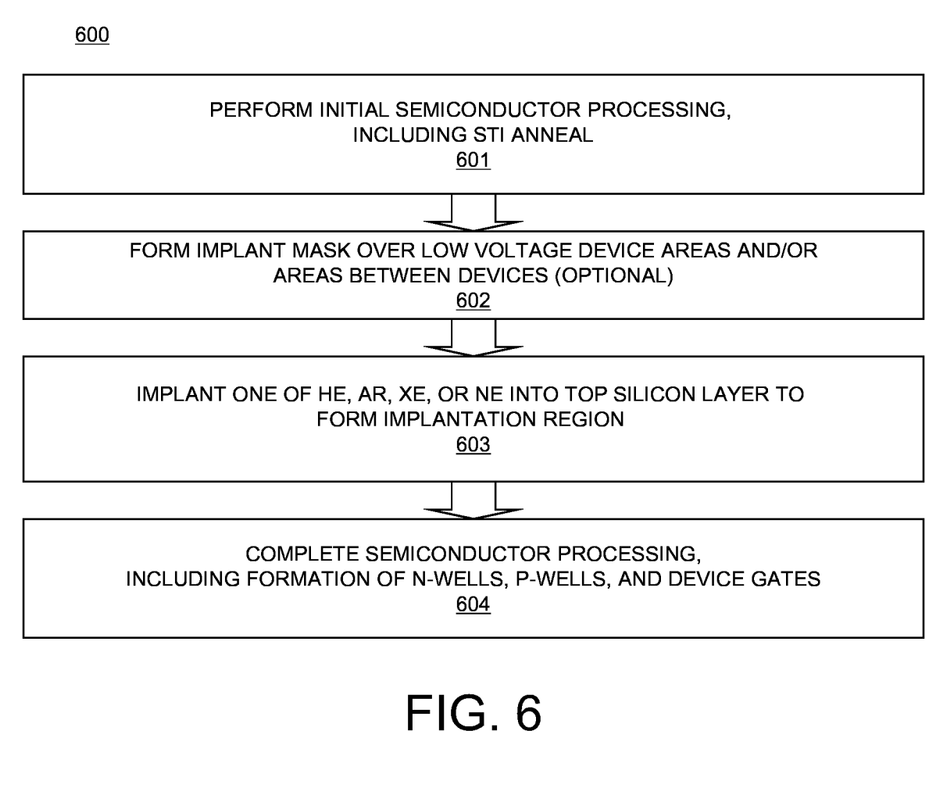
FIG. 6 illustrates a flowchart of an embodiment of a method of forming a noble gas implantation region in a top silicon layer of a semiconductor-on-insulator substrate for high voltage devices.

FIG. 6 shows a flowchart of an embodiment of a method 500 of forming a noble gas implantation region in a top silicon layer of a semiconductor-on-insulator substrate for high voltage devices. In block 601, initial semiconductor processing is performed. This initial semiconductor processing may include formation of STI regions, such as STI regions 204 of FIGS. 2A-D, or STI regions 306 of FIGS. 3A-B, deep trench isolation regions 406 and STI regions 407 of FIGS. 4A-B, or deep trench isolation regions 514 and STI regions 506 of FIGS. 5A-B. Such STI formation includes an STI annealing step. Then, in optional block 602, an implant mask may be formed over the portions of the top silicon layer of the semiconductor-on-insulator substrate. An example of an implant mask 205 was shown in FIG. 2B. The implant mask may expose regions where the high voltage devices are to be formed, and cover lower voltage device areas, or regions located in between high voltage devices. In some embodiments, the implant mask may be omitted, and the implantation is a blanket implantation. Then, in block 603, the top silicon layer of the semiconductor-on-insulator substrate is implanted with a noble gas, including one of He, Ne, Ar, and Xe, to form an implantation region in the top silicon layer. The implantation region may be located at the interface between the BOX layer and the top silicon layer, or at any appropriate depth in the top silicon layer in various embodiments. The depth of the implantation region in the top silicon layer may be selected to control floating body effects in the high voltage devices, and may be in the bottom half of the top silicon layer in some embodiments. Embodiments of He, Ne, Ar, or Xe implantation regions that may be formed in block 603 include implantation regions 105 and 106 of FIGS. 1B-C, implantation regions 209 and 211 of FIGS. 2C-D, implantation regions 311 and 313 of FIGS. 3A-B, implantation regions 408 and 410 of FIGS. 4A-B, and implantation regions 511 and 513 of FIGS. 5A-B. Lastly, in block 604, semiconductor processing is completed to form semiconductor devices in the top silicon layer. This semiconductor processing may include formation of n-wells, p-wells, and/or device gates in various embodiments; for example, n-well 207 and p-well 208 of FIGS. 2C-D; n-wells 304, p-wells 305, and gates 312 of FIGS. 3A-B; n-well 404 and p-well 405 of FIGS. 4A-B, n-wells 304; or n-wells 504, p-wells 505, and gates 512 of FIGS. 5A-B. The semiconductor processing of block 604 may include a well stabilization anneal in some embodiments.

FIGS. 1A-5B are shown for illustrative purposes only. Any appropriate semiconductor device that is formed on a semiconductor-on-insulator substrate may include He, Ne, Ar, or Xe implantation regions in the top silicon layer. The He, Ne, Ar, or Xe implantation regions may be formed by blanket implantation across the entire substrate in some embodiments, or by a masked implant that only implants the He, Ne, Ar, or Xe in certain portions of the substrate (for example, across high-voltage PiN diodes and/or FETs, or any other type of high voltage p-n junction). A semiconductor structure built on a semiconductor-on-insulator substrate that includes high voltage devices with He, Ne, Ar, or Xe implantation regions in the top silicon layer may include any appropriate number, types, and layout of high voltage devices, in addition to any appropriate number, types, and layout of other devices.

The technical effects and benefits of exemplary embodiments include formation of high voltage semiconductor devices on a semiconductor-on-insulator substrate with an implantation region that prevents formation of inversion and/or accumulation layers which may degrade device performance.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of forming of a semiconductor structure on a semiconductor-on-insulator substrate, the semiconductor-on-insulator substrate comprising a handle wafer, a buried oxide (BOX) layer on top of the handle wafer, and a top silicon layer on top of the BOX layer, the method comprising:
   forming a shallow trench isolation region in the top silicon layer;
   implanting the top silicon layer with a noble gas to form an implantation region in the top silicon layer; and
   forming one or more semiconductor devices in the implanted top silicon layer, wherein forming one or more semiconductor devices in the implanted top silicon layer comprises forming an n-well and a p-well of a PiN junction, and wherein the implantation region extends across the n-well, an intrinsic silicon region, and the p-well of the PiN junction.

2. The method of claim 1, wherein the noble gas comprises one of helium (He), neon (Ne), argon (Ar), and xenon (Xe).

3. The method of claim 1, further comprising forming an implant mask on a portion of a top surface of the top silicon layer before implanting the top silicon layer.

4. The method of claim 1, wherein the implantation region is located at an interface between the top silicon layer and the BOX layer.

5. The method of claim 1, wherein the implantation region is located at a depth in the top silicon layer that is in between a top surface of the top silicon layer and an interface between the top silicon layer and the BOX layer.

6. The method of claim 1, wherein the depth of the implantation region is in a bottom half of the top silicon layer.

7. A method of forming of a semiconductor structure on a semiconductor-on-insulator substrate, the semiconductor-on-insulator substrate comprising a handle wafer, a buried oxide (BOX) layer on top of the handle wafer, and a top silicon layer on top of the BOX layer, the method comprising:
   forming a shallow trench isolation region in the top silicon layer;
   implanting the top silicon layer with a noble gas to form an implantation region in the top silicon layer; and
   forming one or more semiconductor devices in the implanted top silicon layer, wherein forming one or more semiconductor devices in the implanted top silicon layer comprises forming an n-well and a p-well of a field effect transistor (FET) in the top silicon layer, wherein the implantation region extends across the n-well, an intrinsic silicon region, and the p-well of the FET.

8. The method of claim 7, wherein the noble gas comprises one of helium (He), neon (Ne), argon (Ar), and xenon (Xe).

9. The method of claim 7, further comprising forming an implant mask on a portion of a top surface of the top silicon layer before implanting the top silicon layer.

10. The method of claim 7, wherein the implantation region is located at an interface between the top silicon layer and the BOX layer.

11. The method of claim 7, wherein the implantation region is located at a depth in the top silicon layer that is in between a top surface of the top silicon layer and an interface between the top silicon layer and the BOX layer.

12. The method of claim 7, wherein the depth of the implantation region is in a bottom half of the top silicon layer.

* * * * *